US006500696B2

(12) United States Patent
Sutherland

(10) Patent No.: US 6,500,696 B2
(45) Date of Patent: Dec. 31, 2002

(54) FACE TO FACE CHIP

(75) Inventor: Ivan E. Sutherland, Santa Monica, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 09/969,701

(22) Filed: Oct. 2, 2001

(65) Prior Publication Data

US 2002/0016021 A1 Feb. 7, 2002

Related U.S. Application Data

(62) Division of application No. 09/418,120, filed on Oct. 14, 1999.

(51) Int. Cl.[7] .................. H01L 21/44; H01L 21/48; H01L 21/50
(52) U.S. Cl. ............. 438/109; 438/108; 438/613; 228/180.1; 228/180.21; 228/180.22
(58) Field of Search ................. 438/108, 109, 438/613; 228/180.1, 180.21, 180.22

(56) References Cited

U.S. PATENT DOCUMENTS

| 4,467,342 A | 8/1984 | Tower |
| 4,697,095 A | 9/1987 | Fuji |
| 4,703,483 A | 10/1987 | Enomoto et al. |
| 4,818,728 A | 4/1989 | Rai et al. |
| 5,202,754 A | 4/1993 | Bertin et al. |
| 5,252,857 A | 10/1993 | Kane et al. |
| 5,438,224 A | 8/1995 | Papageorge et al. |
| 5,523,628 A | 6/1996 | Williams et al. |
| 5,608,262 A | 3/1997 | Dgani et al. |
| 5,629,838 A | 5/1997 | Knight et al. |
| 5,767,009 A | 6/1998 | Yoshida et al. |
| 5,786,979 A | 7/1998 | Douglass |
| 5,818,748 A | 10/1998 | Bertin et al. |
| 5,821,625 A | 10/1998 | Yoshida et al. |
| 5,898,223 A | 4/1999 | Frye et al. |
| 5,909,052 A | 6/1999 | Ohta et al. |

FOREIGN PATENT DOCUMENTS

| JP | 56-148857 A | 11/1981 |
| JP | 4-340758 A | 11/1992 |
| JP | 6-236981 A | 8/1994 |

Primary Examiner—Albert W. Paladini
Assistant Examiner—David A. Zarneke
(74) Attorney, Agent, or Firm—Towsend and Townsend and Crew LLP

(57) ABSTRACT

An integrated circuit device includes first and second arrays of semiconductor dice. Each array of dice is arranged in face-to-face relation to the other array of dice, thus forming a lower layer of dice and an upper layer of dice. The layers are aligned so that each upper layer die straddles two or more of the lower layer dice, thus defining overlap regions. In the overlap regions, signal pads of one layer are aligned with corresponding signal pads of the other layer. The two layers are spaced apart, thus creating a capacitance-based communication path between the upper and lower layers via the signal paths.

20 Claims, 6 Drawing Sheets

FACE TO FACE CHIP

The present application is a Divisional Application of and claims the benefit of pending U.S. patent application Ser. No. 09/418,120, filed on Oct. 14, 1999, which is incorporated by reference in its entirety for all purposes.

BACKGROUND OF THE INVENTION

This invention relates generally to the field of semiconductor integrated circuits, and more specifically to communication among a collection of integrated circuits.

Integrated circuit chips ordinarily communicate with one another through external wiring. Typically, this wiring lies on a printed circuit board. In order to adapt the tiny dimensions of the integrated circuit to the larger dimensions of the wires on the printed circuit board, the integrated circuit is mounted in a "package" made of plastic or ceramic. The package is large enough for people to handle easily and also provides mechanical protection for the chip.

Integral to the package are a collection of metal conductors, one for each connection required on the integrated circuit. At one end, these conductors are large and physically strong enough to attach to the printed circuit board. At the other end, these conductors are of a scale similar to that of the integrated circuit. The actual connection between the integrated circuit and these package conductors is generally a gold or aluminum "bonding wire" that is welded to a pad on the integrated circuit at one end and to the small end of a package conductor at the other.

Thus, there are a series of conductors of varying size between one integrated circuit and the next. First, on the integrated circuit itself, a typical conductor leading from a circuit to the periphery of the integrated circuit is about one micron in width or less. Second, still on the integrated circuit, relatively large transistors drive a bonding pad on the periphery of the integrated circuit. Such bonding pads are about 100 microns square, a very large area when compared with other parts of the integrated circuit. Third, there is the bonding wire connected to the integrated circuit at the bonding pad. The bonding wire is typically 25 micronsin diameter and 400 microns in length and provides the external connection to the bonding pad. Fourth, there is the conductor in the package that connects the bonding wire to the outside of the integrated circuit package. At its small end, it is slightly larger than the bonding pad. At its large end it is of a suitable scale for mounting the integrated circuit to a printed circuit board, typically about 500 microns in size, and on a center-to-center spacing of 1250 microns. Fifth, there is the wire on the printed circuit board. It is about 500 microns wide and typically on the order of a few centimeters in length. At the next chip, there is a similar set of conductors in reverse.

This elaborate arrangement of connectors from one chip to another has two drawbacks. First, it is costly. There are many parts involved and many assembly steps to put them together. The steps include making the packages, installing the integrated circuit chips in them, bonding the pads of the integrated circuit to the conductors in the package, and fastening the packages to the printed circuit board. Although each of these steps is highly automated, nevertheless they remain a major cost factor in many system designs.

Second, it is electrically undesirable. The wires on the printed circuit board are about 1000 times as large as the wires on the integrated circuit. Therefore, to send a signal from one integrated circuit to another requires a large amplifier on the sending integrated circuit. Moreover, the conductors involved have a good deal of electrical capacitance and electrical inductance, both of which limit the speed at which communication can take place. Perhaps worst of all, much energy is required to send a signal through such large conductors, which causes the driving integrated circuit to dissipate considerable power. The cooling mechanisms required to get rid of the resulting head add cost and complexity to the system.

Several methods have evolved to improve chip to chip interconnect. One way is to avoid several packages for the separate integrated circuits. Instead of a package for each circuit, several chips are mounted in a "multi-chip module," a kind of communal package for the chips. The multi-chip module (MCM) contains wiring that carries some of the chip-to-chip communication circuits. The size of the wires in the MCM is smaller than the wires on a printed circuit, but not yet so small as the wiring on the chips themselves. Electrical capacitance and inductance in the wires between chips remains a problem even in MCMs.

An advancement made in the field of MCM fabrication is described in U.S. Pat. No. 5,767,009, illustrating in FIG. 18 of the patent stacked plural IC devices 91, 96. FIGS. 19A–19F of the '009 patent illustrate the fabrication steps. First, as shown in FIG. 19A, a barrier metal layer 93 of titanium, palladium, or gold is formed by the electron beam evaporation method or the like. Then, the surface is covered with a photoresist 101 using photolithographic techniques, excluding an area of a first electrode pad 92, as shown in FIG. 19B. Then, in FIG. 19C, lead- or tin-based solder which is to become bump 95 is formed on barrier metal layer 93 above electrode pad 92 by means of electroplating or the like. After removing photoresist 101, barrier metal layer 93 is etched off with aqua regia, fluoric acid, or the like, leaving an area above the electrode pad in FIG. 19D. Barrier metal 98 is formed also on second semiconductor chip 96 by the same process. Next, as shown in FIG. 19E, bump 95 of first semiconductor chip 91 is aligned to barrier metal 93 of second semiconductor chip 96, and then the two are coupled together by heating or by pressing. Then, as shown in FIG. 19F, insulation resin 100 is provided between first semiconductor chip 91 and second semiconductor chip 96, and cured; thus the mounting of first semiconductor chip 91 on second semiconductor chip 96 is completed.

As can be seen, the fabrication of such multi-chip devices is not any less complicated than providing separately packaged IC devices and assembling the individual devices on a printed circuit board. The additional steps of laying down a metal layer and the various photolithographic steps increase the cost of manufacture and are a source of process problems which can lower production yields further adding to the overall cost.

SUMMARY OF THE INVENTION

An integrated circuit comprises first and second semiconductor dice. The first and second dice arranged so that their respective signal pads thereof are placed in face-to-face manner, forming lower and upper layers of semiconductor dice. Some of the signal pads of one die are in alignment with some of the signal pads of the other die. The first and second dice are spaced apart by air an gap, in one embodiment of the invention, and by a dielectric layer, in another embodiment of the invention. This arrangement creates capacitances between the aligned signal pad. Changing the electrical potential at a signal pad of the first die results in a corresponding electrical change at the opposing signal pad by virtue of the capacitive coupling. Signaling between the signal pads therefore is effectuated by detecting the changing electrical potential.

The semiconductor dice can be of a variety of shapes. The dice are arranged in planar fashion and in a regular pattern. In one embodiment of the invention, the upper and lower layer dice are rectangular in shape. In another embodiment of the invention, the dice have an octagonal shape.

A dielectric material is used to separate the first and second dice. In another variation, the signal pads are spaced apart by raised areas on the surface in which the signal pads are disposed. In yet another variation, the signal pads are spaced apart by recessing the signal pads below the surface of the semiconductor dice.

DESCRIPTION OF THE SPECIFIC EMBODIMENTS

Figure 1:
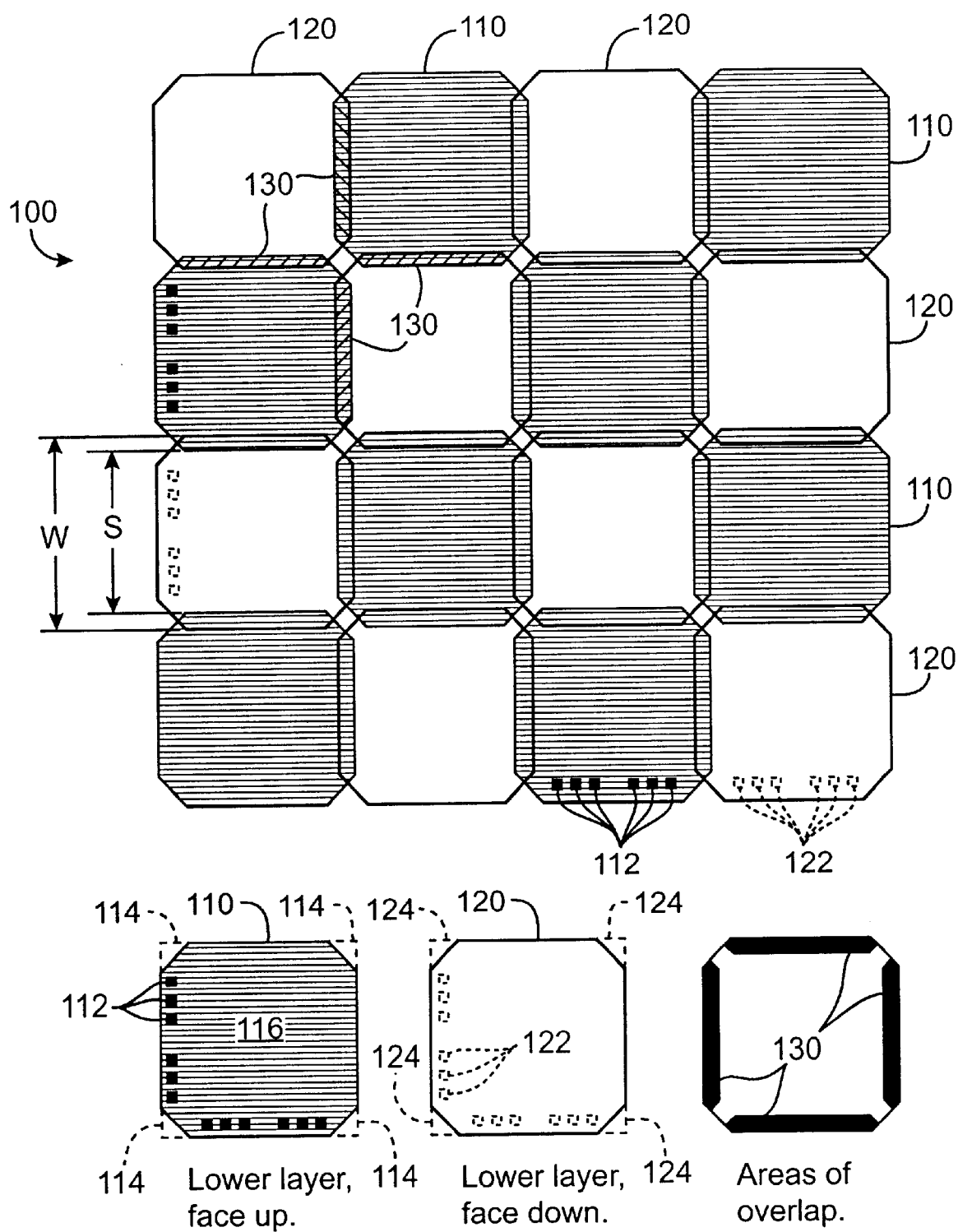
FIG. 1 is a simplified diagram of overlapping integrated devices in accordance with one embodiment of the present invention.

FIG. 1 shows, in schematic fashion, a top view of integrated circuit (IC) device 100 in accordance with the present invention. IC device 100 comprises first and second sets of IC semiconductor dice 110, 120. Each die is understood to contain a variety of logic and support circuitry typically found on semiconductor dice. As will be explained in connection with the embodiment illustrated in FIG. 1, dice 110, 120 are largely square in shape with corner portions removed to form octagonal elements. However, as will be discussed later, this is not a requirement for practicing the invention.

The first set of dice 110 are shown oriented face-up, exposing the active side 116. As can be seen in FIG. 1, the active side has form therein a plurality of signal pads 112, also exposed to the viewer. Signal pads 112 are of the type commonly used for bonding wires to provide a signal path to the pins of an IC package. Signal pads 112 are also referred to as wire bond pads. The areal dimensions for the signal pads can be the same dimensions used for conventional wire bond pads. However, for the purposes of the present invention the particular dimensions are not critical. Signal pads 112 can be made smaller; or even larger, if a particular application calls for larger pad sizes. The signal pads do not have to be square-shaped as shown in FIG. 1, but rather can be of any shape that is convenient for a given application of the present invention, or even of varying shapes and sizes within the same die.

The second set of dice 120 are shown with their active surfaces facing downward. In the embodiment shown in FIG. 1, dice 120 have substantially the same square-shaped dimensions as dice 10. Each of dice 120 includes associated signal pads 122, which are shown in phantom lines since the dice are shown face-down. As with signal pads 112 of dice 110, signal pads 122 of dice 120 can be conventional wire bond pads, or can be of different sizes and shapes. However, for reasons to be discussed below, some of the signal pads on dice 110 and some of the signal pads on dice 120 should have corresponding positions.

Dice 110 are arranged so that the active sides lie substantially on a common plane forming a lower layer of semiconductor dice. Dice 110 are further arranged in an alternating and repeating pattern that resembles a checkerboard pattern of "dark squares" (namely, dice 110) and "light squares" (namely, spaces between dice 110). Similarly, dice 120 are arranged in the same checkerboard pattern to form an upper layer of semiconductor dice. Dice 120 are further arranged so as to be displaced relative to the position of dice 110 such that dice 120 are not directly positioned above dice 110. Rather, dice 120 are positioned above the "light squares" (spaces) of the checkerboard pattern formed by the lower layer of dice.

Upon closer observation, it can be seen that the checkerboard pattern of the lower layer dice 110 comprises unequally sized "squares." More specifically, the separation distance, S, between one die and its nearest neighbor on the lower layer, for example, is smaller than the width W of each die. Thus the "light squares" of the checkerboard pattern are smaller than the "dark squares." Upper layer dice 120 are arranged in similar fashion. This arrangement is made possible by removing the corner portions 114 of dice 110 and the corner portions 124 of dice 120, thereby forming octagonal-shaped dice. This permits the dice in each layer to be cater-cornered closer to each other than would be possible had corner portions 114, 124 not been removed. The octagonal-shaped dice can thus be arranged with a resulting inter-die spacing S that is less than the die width W.

This spacing arrangement results in the dice in the upper layer overlapping the dice in the lower layer to define areas of overlap 130. These areas of overlay create an opportunity for the formation of signal paths between lower layer dice 110 and upper layer dice 120. Signal pads 112 of dice 110 and signal pads 122 of dice 120 are aligned with each other in the overlap areas. Since the pads are not in physical contact with each other, there is a capacitance between signal pads 112 of the lower layer dice 110 and correspondingly aligned signal pads 122 of the upper layer dice 120. It is this capacitive coupling that provides a signal path between the lower and upper layer dice. Changes in the electrical potential of the surface metal of a signal pad cause corresponding changes in the electrical potential of the metal comprising the corresponding signal pad. Suitable drivers and sensing circuits in the respective dice make communication through this small capacitance possible. A variety of such driver circuits and sensing amplifiers are well known to those of ordinary skill in the art.

It is noted that the preferred embodiment of the invention calls for proximate positioning of the lower and upper layers of chips rather than physically contacting the two layers. While the latter is contemplated, maintaining a separated layers permits subsequent replacement of a chip.

Figure 4:
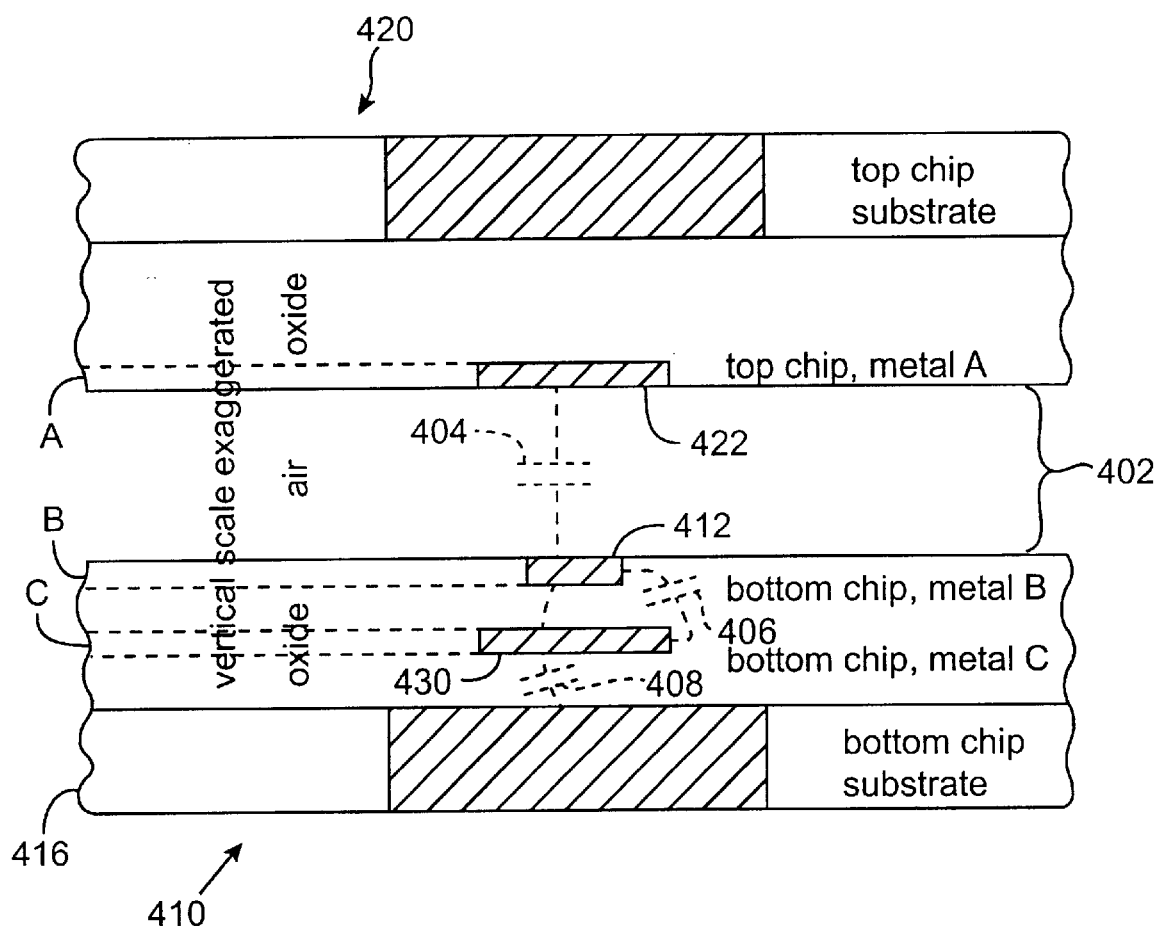
FIG. 4 is simplified cross-sectional illustration of the signaling path provided by the preset invention.

The main problem of communicating between the dice in this manner is that the useful capacitance between a pair of aligned signal pads is very small. Referring to FIG. 4, a simplified schematic shows a cross-sectional representation of a pair of aligned signal pads 412 and 422 of dice 410 and 420 respectively. Dice 410 and 420 are separated by an air gap 402, thus creating a capacitance 404 between signal pads 412 and 422. Device dimensions including the vertical scale are exaggerated for illustrative purposes. As shown, pad 422 is formed in metal layer A of die 420. Pad 412 is formed in metal layer B of die 410. Die 410 also includes a conductive terminal 430 formed in another metal layer C. The dielectric material between pad 412 and terminal 430 creates another capacitance 406 between the pad and terminal. In addition, there is a capacitance 408 between pad 412 and chip substrate 416 of die 410. Assuming that the electrical potential of pad 422 is changing (as would be the case during the transmission of a signal from pad 422 to pad 412), corresponding changes to the potential at pad 412 tend to be hindered by its capacitance 408 to substrate 416. By actively driving the potential of terminal 430 so as to reduce the effective capacitance 408, the changing electrical potential of pad 422 can be detected. These capacitive shielding techniques are known and an artisan of ordinary skill in the relevant arts would realize that a variety of circuits and techniques can be used to detect the variations in electrical potential.

Figure 2:
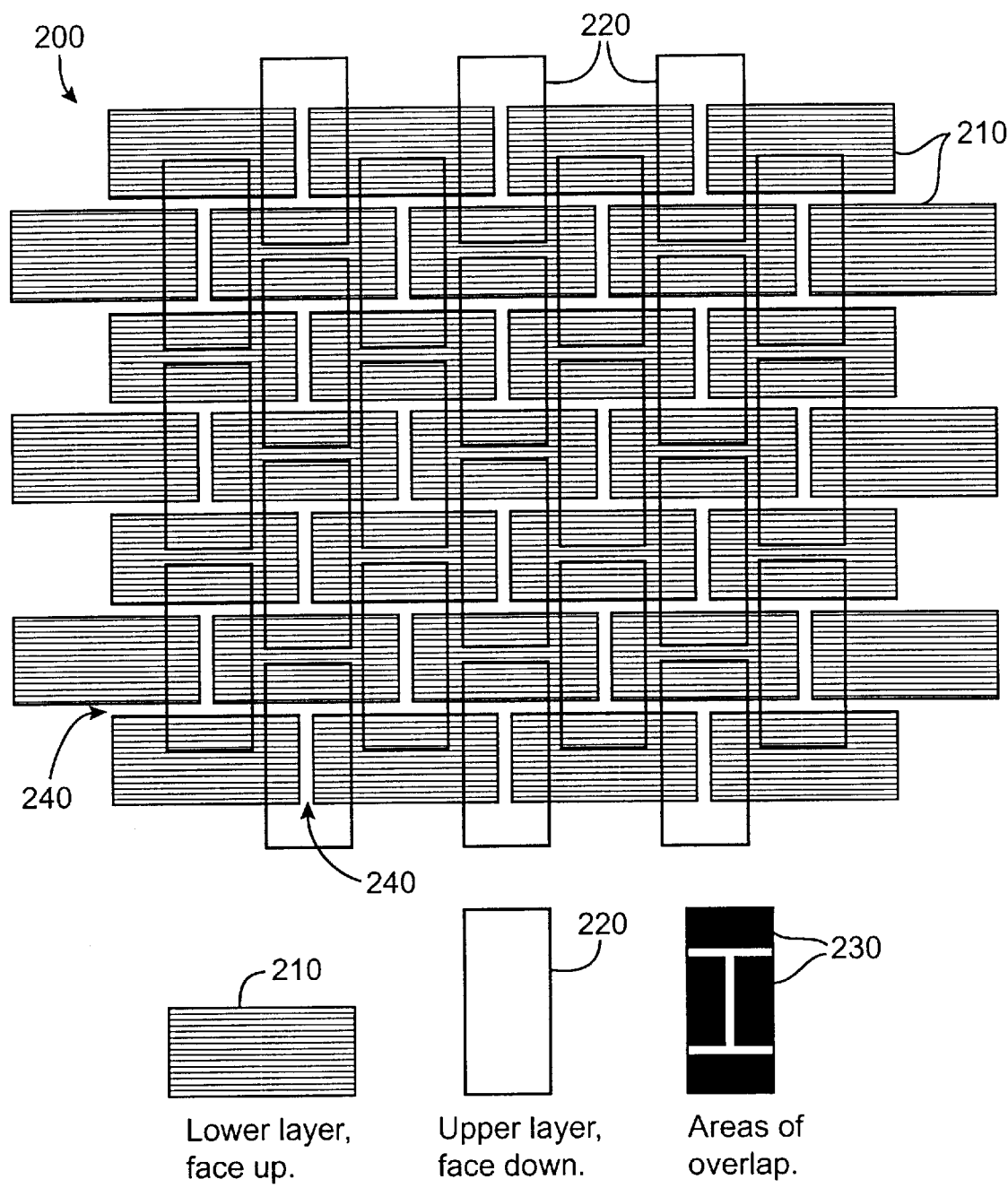
FIG. 2 shows a simplified diagram of an alternative embodiment of overlapping integrated device in accordance with the present invention.

FIG. 2 shows another embodiment of the present invention. There, a simplified illustration of an array 200 of semiconductor dice 210 and 220 is shown arranged in a lower layer of dice 210 and an upper layer of dice 220. The dice are rectangular in shape, with the dice comprising the lower layer being arranged in a brickwork pattern. Likewise, the dice in the upper layer are also arranged in a brickwork pattern. The upper layer pattern is rotated 90° relative to the lower layer dice 210. The upper layer dice 220 are aligned relative to the lower layer dice 210 so that each upper die 220 can overlap four of the lower dice. Comparing to FIG. 1, each upper layer die 120 also is shown overlapping four lower dice 110. However, the overlap areas 130 in FIG. 1 encompass only those signal pads located along the periphery of the dice. In contrast, the overlap areas 230 of the arrangement shown in FIG. 2 encompass larger areal portions of each die.

Figure 3:
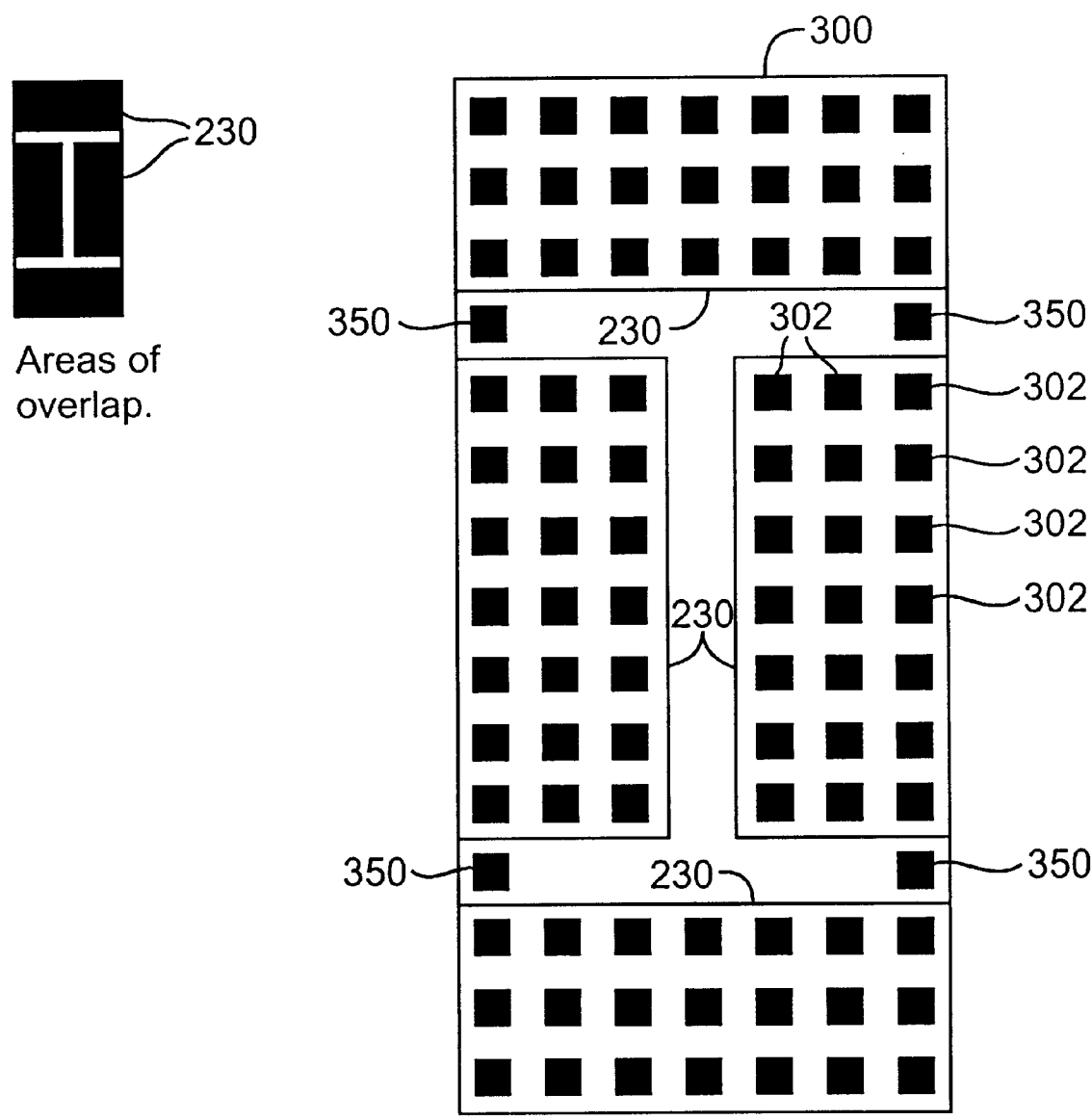
FIG. 3 illustrates an array of signaling paths provided by the present invention.

With reference to FIG. 3, the larger overlap area creates an opportunity to use ball grid array (BGA) type pinouts. The simplified illustration of FIG. 3 shows a die 300 having an array of signal pads formed on one of its major surfaces, such as might be found with conventional BGA-type devices. As can be seen, most of the signal pads 302 are located within the overlap areas 230. The increased size of overlap areas 230 contains more signal pads 302 than the overlap areas 130 shown in FIG. 1. This provides more signal paths between the upper and lower layers than is possible for similarly-sized dice using the configuration illustrated in FIG. 1.

Some signal pads 350, however, lie outside of the overlap areas in gaps 240 (FIG. 2) formed between the dice in the lower (or upper) layer. The gaps leave room for conductors that bring power to a die and provide a ground path for the die, and in general signal-carrying conductors. Wires are bonded to signal pads 350 using conventional wire bonding techniques.

Figure 5A:
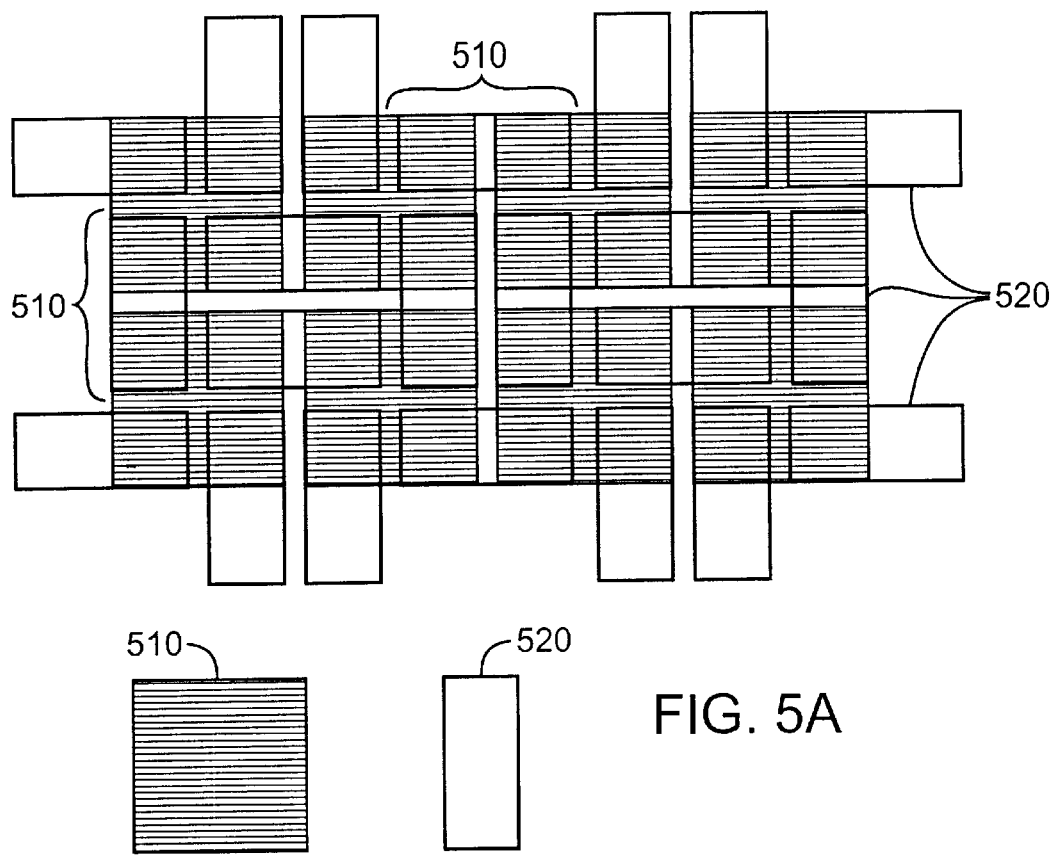
FIGS. 5A–5B illustrate the general shapes that IC dice can take on in accordance with the present invention.

The brickwork pattern shown in FIG. 2 illustrates that side-by-side placement of the dice in each of the lower and upper layers increases the relative area of overlap. This in turn increases the number of signal pads for communication between the lower and upper layers. Although dice 210, 220 are rectangular as shown in FIG. 2, that need not be the case. As can be seen in the simplified illustrations of FIGS. 5A and 5B, the dice can take on any shape. In FIG. 5A, for example, a lower layer of dice comprises square-shaped dice 510 arranged in a first regular pattern. The upper layer dice comprise rectangular-shaped dice 520 arranged in a second regular pattern. The second pattern, however, is not the same brickwork pattern as shown in FIG. 2. The upper dice 520 are aligned relative to the lower dice 510 so that each of the upper dice straddle at least two of the lower dice. While the arrangements shown are regular patterns, irregular patterns could also be used.

Figure 5B:
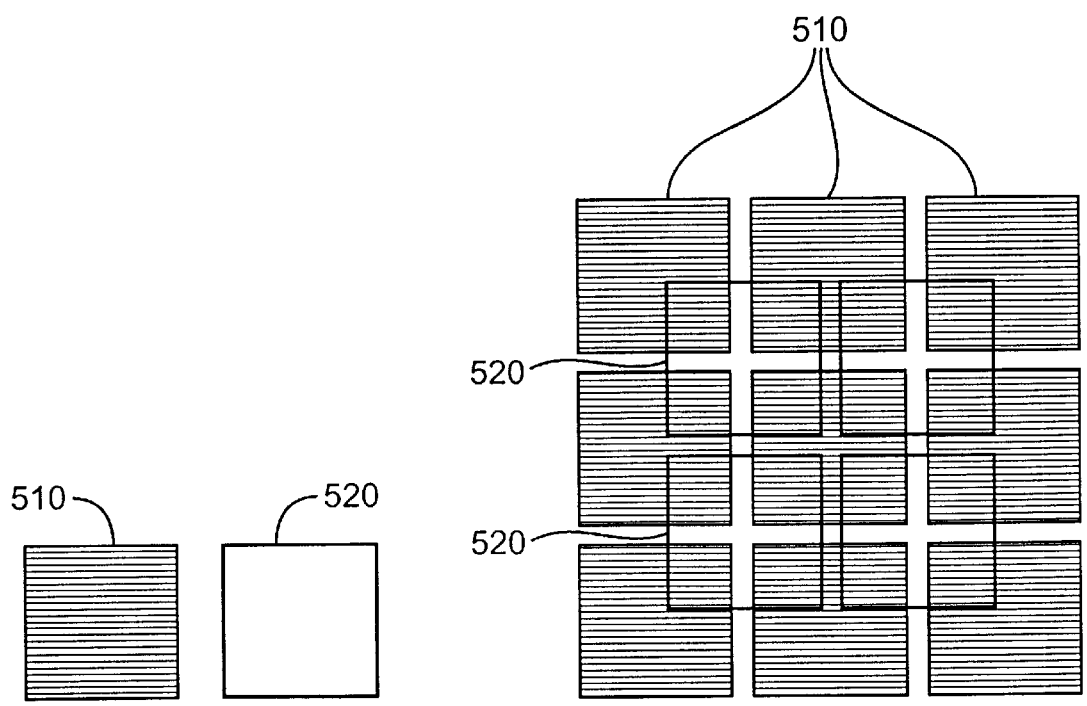

FIG. 5B shows an arrangement of lower dice 510 and upper dice 520 layers using square-shaped dice for both layers. Here, each layer is arranged in a matrix pattern. The upper layer dice 520 are offset so that each upper layer die overlaps four lower layer die. Various other shapes are contemplated. For example, the dice can take on a hexagonal shape. Furthermore, the dice comprising a layer need not all be the same. The layer may comprise a combination of dice of different shapes. Conventional techniques produce square- and rectangular-shaped dice. The selection of a particular shape will be driven by the particular use of the invention and the available processing technology. The invention contemplates the use of other shapes that might become available as fabrication techniques continue to evolve.

Figure 6A:
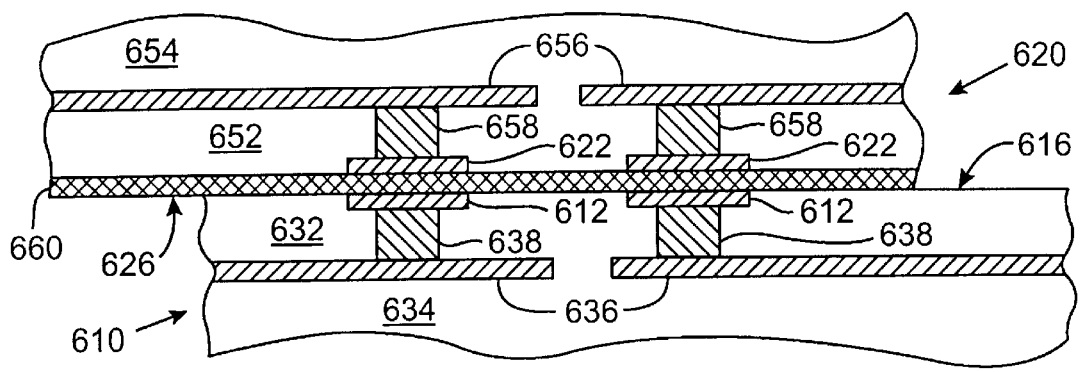
FIGS. 6A–6C illustrate alternative methods of providing separation of the IC dice.

With reference to FIG. 6A, a simplified cross-sectional illustration of two dice, lower layer die 610 and upper layer die 620, arranged in accordance with the invention is shown. The cross-sectional view of lower layer die 610 shows an uppermost insulation layer 632, such as silicon dioxide. Insulation layer 632 defines a first major surface 616. A metal layer 636 includes devices and traces comprising the circuitry of the semiconductor chip. The additional layers of insulation and metal which comprise the remainder of die 610 are shown in generalized manner as region 634. Vias 638 are formed through insulation layer 632 to the underlying metal layers to provide electrical access to those underlying metal layers. Signal pads 612 disposed in insulation layer 632 provide a contact surface for vias 638.

The cross-sectional view of upper layer die 620 shows similar structure. There is an insulation layer 652. Below that is a metal layer 656 containing various active devices and traces. Signal pads 622 disposed in insulation layer 622 provide electrical paths to the underlying metal layer by way of vias 658. The remaining layers which constitute the rest of semiconductor die 620 are shown collectively as region 654. Disposed atop insulation layer 652 is a dielectric layer 660.

The position of signal pads 612 and 622 are selected to create alignment between the pads when their respective dice are arranged in the manner disclosed above. As shown in FIG. 6A, dielectric layer 660 is formed on the surface of die 620 to provide both a dielectric medium and the spacing between signal pads to establish a capacitance-based communication path. Any appropriate conventional dielectric material is contemplated. Depending on the particular use, a high dielectric constant oil can be disposed between chip layers.

Although FIG. 6A shows dielectric layer 660 being formed only on the surface of die 620, this is not necessary. It may be desirous from a processing point of view to deposit a dielectric film over both dice 610, 620. This may facilitate manufacturing by providing a uniform set of processing steps. A dielectric film would also serve to increase device reliability by providing protection for its circuits.

Figure 6B:
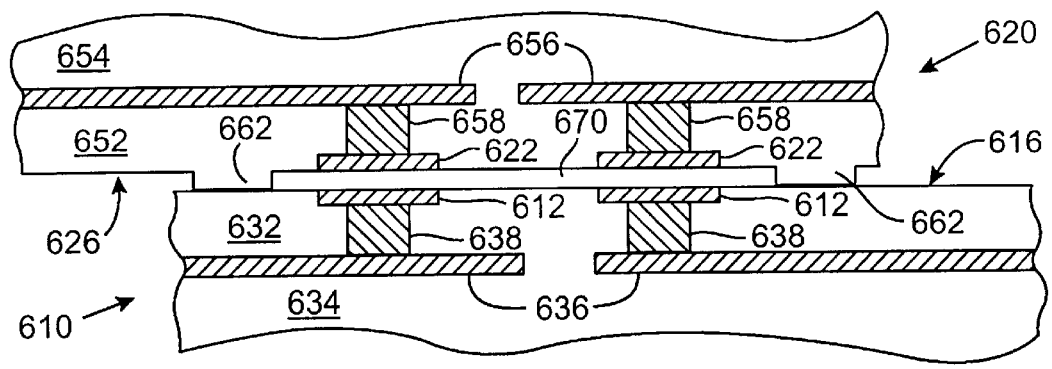

FIG. 6B shows an alternate embodiment of the invention which does not require the formation of the dielectric layer 660 shown in FIG. 6A. In this embodiment, insulation layer 652 features raised areas 662 which provide a space 670 between the dice 610, 620. The raised portions are formed on those areas on the insulation layer which do not have signal pads. In a variation of this embodiment, both lower layer die 610 and upper layer die 620 are provided with the raised portions. This may facilitate manufacturing by providing a single mask for etching the insulation layer, instead of having two different masks, one with the raised areas and one without the raised areas.

Figure 6C:
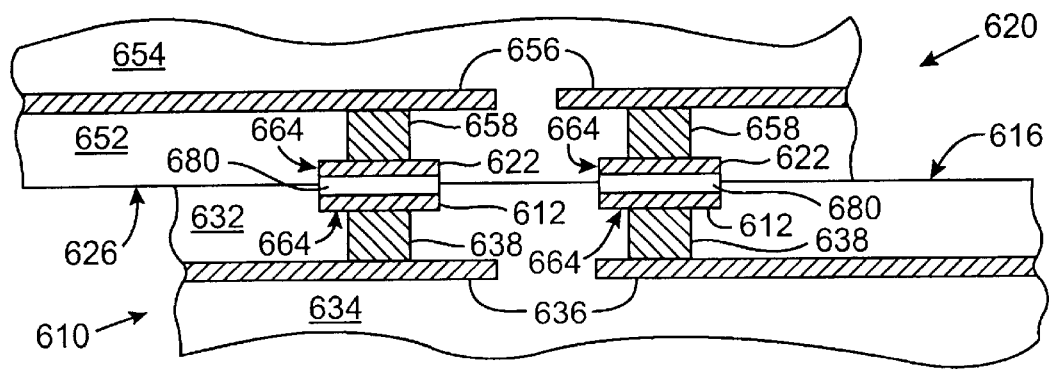

FIG. 6C shows yet another alternate embodiment of the invention which obviates the steps for forming dielectric layer 660 (FIG. 6A) and for creating raised areas 662 (FIG. 6B). In the embodiment of FIG. 6C, recesses 664 are formed in insulation layer 652 and 632 of respective dice 620 and 610. The vias 658 and 638 are brought up to the bottom of the recesses. Signal pads 622 and 612 are formed in the bottom of the recesses but are not brought to the surfaces 626 and 616 of the respective insulation layers 652 and 632. The formed signal pads are therefore recessed relative to the surfaces. When the two dice 610 and 620 are brought into face-to-face contact, a space 680 remains between signal pads 622, 612 by virtue of the pads being recessed beneath their respective surfaces 626, 616. In one variation of this embodiment, the signal pads of die 610 are flush with surface 616, while the signal pads of die 620 are recessed relative to surface 626. This may simplify manufacturing in that only one set of dice need the additional processing to produce recessed signal pads.

The above embodiments can be intermixed to separate the upper and lower layer dice. For example, one set of dice may feature recessed signal pads while the other set of dice features insulation layers having raised portions. These and other variations are possible while maintaining the spirit of the invention and staying within the scope of the invention as recited in the following claims.

What is claimed is:

1. A method of fabricating an integrated circuit device, comprising:

providing a plurality of first dice, said first dice each having signal pads formed on a surface thereof;

providing a plurality of second dice, said second dice each having signal pads formed on a surface thereof; and arranging said first dice so that each of said first dice overlaps at least three of said second dice, and each of said second dice overlaps at least three of said first dice, thereby defining overlap areas, wherein at least some signal pads of said plurality of first dice are configured to be capacitively coupled to corresponding signal pads of said second dice in said overlap areas.

2. The method of claim 1 wherein providing said plurality of first dice and second dice include forming a dielectric layer on some of said first dice and second dice, so that signal pads in said overlap areas are spaced apart.

3. The method of claim 1 wherein said plurality of first dice are rectangles.

4. The method of claim 3 wherein said plurality of second dice are rectangles.

5. The method of claim 3 wherein said plurality of second dice are squares.

6. The method of claim 1 wherein said plurality of first and second dice are shaped as octagons.

7. The method of claim 1 further comprising:

arranging said first dice to form a first two-dimensional repeating pattern; and arranging said second dice to form a second two-dimensional repeating pattern.

8. The method of claim 1 further comprising:

capacitively coupling some signal pads of said first dice to some signal pads of said second dice in said overlap areas.

9. A method of fabricating an integrated circuit device, comprising:

providing a plurality of first dice, said first dice each having first signal pads formed on a surface thereof;

providing a plurality of second dice, said second dice each having second signal pads formed on a surface thereof; and arranging said first dice so that each first die overlaps at least two of said second dice, thereby defining overlap areas, wherein said first signal pads located in said overlap areas are configured to be capactively coupled to some of said second signal pads, wherein said first dice or said second dice have raised areas relative to said surfaces, the raised areas of each of said first or said second die contacting an area on one of the overlapping die.

10. The method of claim 9 wherein each of said first dice and said second dice have raised areas relative to said surfaces, and the signals pads in said overlapping areas are disposed in between said raised areas.

11. The method of claim 10 wherein each of said raised areas of said first dice contact one of the raised areas of said second dice.

12. The method of claim 9 wherein said plurality of first dice are on a plane that is above each of said plurality of second dice.

13. The method of claim 9 wherein the plurality of first dice comprises signal pads that do not overlap one of the plurality of second dice.

14. The method of claim 9 wherein arranging said first dice further comprises arranging said first dice so that each first die overlaps at least three of said second dice.

15. A method of fabricating an integrated circuit device, comprising:

providing a plurality of first dice, said first dice each having signal pads formed on a surface thereof;

providing a plurality of second dice, said second dice each having signal pads formed on a surface thereof;

arranging said first dice so that each first die overlaps at least four of said second dice, thereby defining overlap areas; and aligning said first dice so that signal pads thereof located in said overlap areas are configured to be capacitively coupled to some signal pads of said second dice.

16. The method of claim 15 wherein said plurality of first dice are on a plane that is above each of said plurality of second dice.

17. The method of claim 15 wherein each of the plurality of first dice comprises four sides, and each of said first dice overlaps one of said plurality of second dice on each of said four sides of said first dice.

18. The method of claim 15 wherein the plurality of first dice comprises signal pads that do not overlap one of the plurality of second dice.

19. The method of claim 15 wherein at least some of said signal pads in said plurality of first dice are capacitvely coupled to a chip substrate within said first dice.

20. The method of claim 15 wherein at least some of said signal pads in said plurality of first dice are coupled to a chip substrate through vias within said first dice.

* * * * *